(12) United States Patent
Cai et al.

(10) Patent No.: US 11,515,314 B2
(45) Date of Patent: Nov. 29, 2022

(54) ONE TRANSISTOR TWO CAPACITORS NONVOLATILE MEMORY CELL

(71) Applicant: GLOBALFOUNDRIES Singapore Pte. Ltd., Singapore (SG)

(72) Inventors: Xinshu Cai, Singapore (SG); Lanxiang Wang, Singapore (SG); Yongshun Sun, Singapore (SG); Eng Huat Toh, Singapore (SG); Shyue Seng Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 279 days.

(21) Appl. No.: 16/892,316

(22) Filed: Jun. 4, 2020

(65) Prior Publication Data

US 2021/0384204 A1    Dec. 9, 2021

(51) Int. Cl.
*H01L 27/11521* (2017.01)
*H01L 27/11519* (2017.01)

(52) U.S. Cl.
CPC .. *H01L 27/11521* (2013.01); *H01L 27/11519* (2013.01)

(58) Field of Classification Search
CPC ......... H01L 27/11521; H01L 27/11519; H01L 27/11558; H01L 28/40; G11C 5/10; G11C 16/04
See application file for complete search history.

(56) References Cited

U.S. PATENT DOCUMENTS

| 7,099,192 | B2 | 8/2006 | Wang et al. | |
| 8,193,576 | B2* | 6/2012 | Ko | H01L 29/40114 |
| | | | | 438/266 |
| 9,362,374 | B2* | 6/2016 | Tan | H01L 29/7881 |

OTHER PUBLICATIONS

Chan-Soo Lee et al., Effect of MIM and n-Well Capacitors on Programming Characteristics of EEPROM, Transactons on Electrical and Electronic Materials, Feb. 25, 2011, pp. 35-39, vol. 12, No. 1., Kieeme.

* cited by examiner

*Primary Examiner* — Allison Bernstein
(74) *Attorney, Agent, or Firm* — David Cain (57) ABSTRACT

A nonvolatile memory device is provided. The device comprises a memory transistor. A first capacitor is coupled to the memory transistor. A second capacitor is coupled to the memory transistor. The second capacitor comprises a first electrode and a second electrode. The first capacitor and the second capacitor are connected to separate input terminals.

19 Claims, 8 Drawing Sheets

ONE TRANSISTOR TWO CAPACITORS NONVOLATILE MEMORY CELL

FIELD OF THE INVENTION

The disclosed embodiments relate generally to semiconductor memory devices, and more particularly, to a nonvolatile memory with low program and erase voltages and improved reliability.

BACKGROUND

A nonvolatile memory device retains stored data even if power is turned off. Nonvolatile memory is currently available in several forms, including electrically erasable programmable read only memory (EEPROM) and flash EEPROM. Current flash memory architecture utilizes a memory transistor having a gate electrode over a semiconductor substrate and a dielectric layer between the gate electrode and the semiconductor substrate. A drain region in the substrate may be adjacent to the dielectric layer of the memory transistor and a source region in the substrate may be adjacent to an opposite side of the dielectric layer from the drain region. The gate electrode may be a floating gate. An n-well capacitor coupled to the gate electrode may be used to bias the floating gate.

Programming the memory device may result in storage of electrons in the floating gate and erasing the memory device may expel the stored electrons in the floating gate. During programming, a high voltage above 9V may be applied to the n-well capacitor and to the drain of the memory transistor. A lower voltage may be applied to the source of the memory transistor and the semiconductor substrate may be grounded. A strong vertically oriented electric field in a channel region between the source and the drain may be created resulting in injection of hot electrons to an edge portion of the floating gate from the channel region. During erasing, a high voltage above 9V may be applied to the drain. The n-well capacitor, the source and the substrate may be grounded. Electron hole pairs may be generated in the drain region by band to band tunneling (BTB). The generated holes may be accelerated by a lateral electric field toward a channel region between the source and the drain and some of them may obtain high energy. The hot holes may be injected into the floating gate through the dielectric layer and recombine with the electrons stored in the floating gate.

As high voltages are required for the program and erase operations, low voltage devices such as 3V or 5V devices may face challenges as high voltages are usually generated by a charge pump circuit which is composed of low voltage devices such as 3V or 5V devices. The erase mechanism is inefficient as the n-well capacitor is grounded. The n-well capacitor may be adjacent to a p-substrate. It is not possible to apply a negative voltage to the n-well capacitor to improve the erase efficiency as it may induce unwanted forward bias current between the n-well capacitor and the adjacent p-substrate. Thus, there is an urgent need for an improved flash memory device structure to overcome the challenges mentioned above.

SUMMARY

In an aspect of the present disclosure, a nonvolatile memory device is provided. The device comprises a memory transistor. A first capacitor is coupled to the memory transistor. A second capacitor is coupled to the memory transistor. The second capacitor comprises a first electrode and a second electrode. The second electrode of the second capacitor is connected to an input terminal.

In another aspect of the present disclosure, a nonvolatile memory device is provided. The device comprises a memory transistor comprising a gate electrode. A first capacitor is coupled to the gate electrode of the memory transistor. A second capacitor is coupled to the gate electrode of the memory transistor. The second capacitor comprises a first electrode, an insulating layer adjacent to the first electrode and a second electrode adjacent to the insulating layer. The second electrode of the second capacitor is connected to an input terminal.

In yet another aspect of the present disclosure, a method of fabricating a nonvolatile memory device is provided. The method comprises providing a memory transistor. A first capacitor coupled to the memory transistor is provided. A second capacitor coupled to the memory transistor is provided. The second capacitor comprising a first electrode and a second electrode. The second electrode of the second capacitor is connected to an input terminal.

Numerous advantages may be derived from the embodiments described below. The second capacitor enables independent control of the voltage applied to the gate electrode of the memory transistor and improved program and erase efficiency. The gate electrode may be a floating gate. Applying a negative voltage to the second capacitor during an erase operation lowers erase bias and improves erase efficiency. Application of a positive voltage to the second capacitor during a program operation lowers program bias and improves program efficiency. The second capacitor leads to improved program efficiency by increasing a coupling ratio of the memory device. The term "floating gate" may refer to a gate electrode that is surrounded by an insulator. The term "coupling ratio" may indicate the voltage transfer capability from the n-well capacitor and the second capacitor to the floating gate. The second capacitor may be positioned above the floating gate, thereby leading to a compact nonvolatile memory device.

BRIEF DESCRIPTION OF THE DRAWINGS

The disclosed embodiments will be better understood from a reading of the following detailed description, taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

Figure 1A:
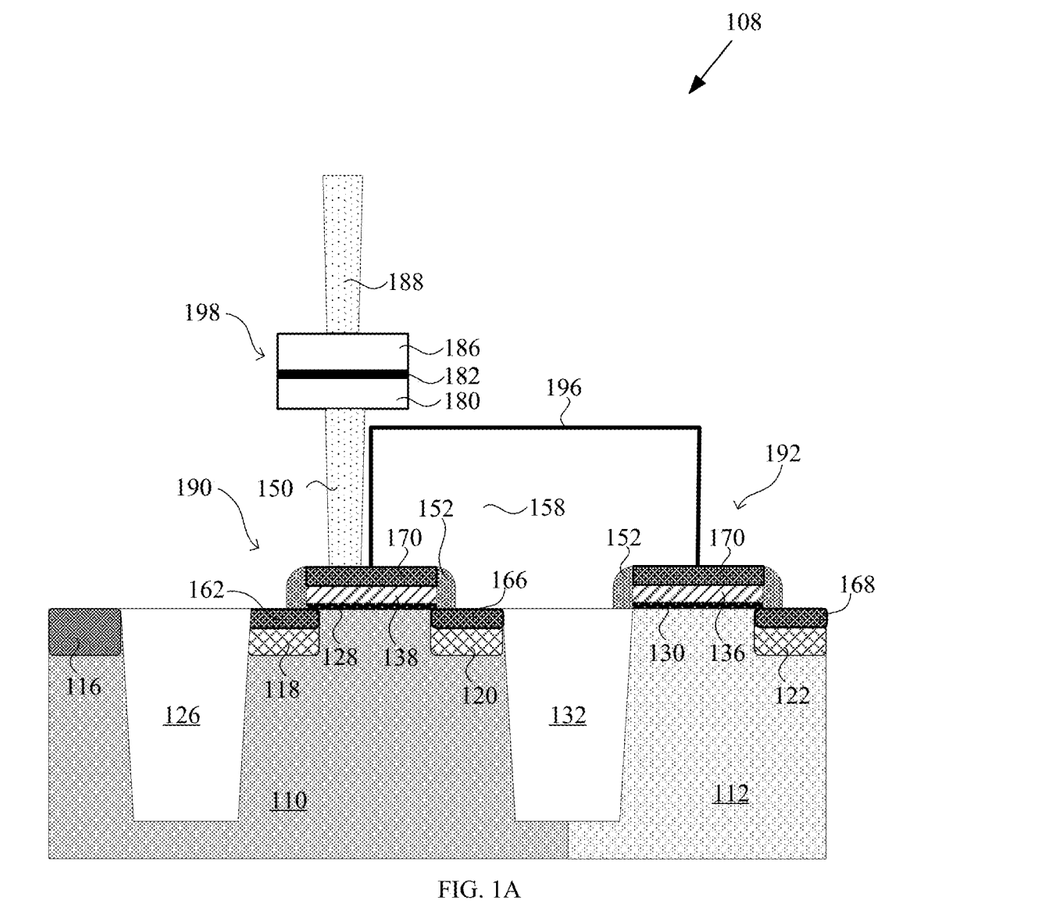
FIG. 1A is a schematic view of a nonvolatile memory device, according to embodiments of the disclosure.

FIG. 1A is a schematic view of a nonvolatile memory device 108, according to embodiments of the disclosure. In embodiments, the nonvolatile memory device 108 may be an EEPROM device or a flash EEPROM device. Referring to FIG. 1A, the memory device 108 comprises a memory transistor 190 and a first capacitor 192. The memory transistor 190 comprising a gate electrode 138 is coupled to the first capacitor 192 by an electrical connection 196, shown as a simplified line in FIG. 1A. As a non-limiting example, the first capacitor 192 may be an n-well capacitor which may be coupled to the gate electrode 138 of the memory transistor 190. A second capacitor 198 may be coupled to the memory transistor 190. The second capacitor 198 comprises a first electrode 180, an insulating layer 182 adjacent to the first electrode 180 and a second electrode 186 adjacent to the insulating layer 182. The first electrode 180 of the second capacitor 198 may be coupled to the gate electrode 138 of the memory transistor 190 by a first conductive contact 150. The second electrode 186 of the second capacitor 198 may be connected to an input terminal by a second conductive contact 188. The first capacitor 192 and the second capacitor 198 may be connected to separate input terminals for independent control of the memory transistor 190.

In embodiments, the first electrode 180 and the second electrode 186 of the second capacitor 198 may comprise metallic materials such as titanium nitride (TiN) or copper (Cu). The insulating layer 182 may be made of silicon dioxide, silicon nitride, high dielectric constant materials such as hafnium dioxide ($HfO_2$), aluminum oxide ($Al_2O_3$), any other suitable insulating materials or its combination. The first electrode 180 and the second electrode 186 of the second capacitor 198 may be above the gate electrode 138 of the memory transistor 190. A silicide layer 170 may be formed between the first conductive contact 150 and the gate electrode 138. The gate electrode 138 of the memory transistor 190 may be a floating gate. In embodiments, the gate electrode 138 may be made of a doped polysilicon.

The memory transistor 190 may comprise a semiconductor substrate 110 below the gate electrode 138 of the memory transistor 190. The semiconductor substrate 110 may be p-doped and comprises a p-well. A dielectric layer 128 of the memory transistor 190 may be placed between the gate electrode 138 and the semiconductor substrate 110. A drain 120 of the memory transistor 190 may be formed in the semiconductor substrate 110, adjacent to the dielectric layer 128. A source 118 of the memory transistor 190 may be formed in the semiconductor substrate 110, adjacent to an opposite side of the dielectric layer 128 from the drain 120 of the memory transistor 190. A silicide layer 162 may be formed above the source 118 of the memory transistor 190 and a silicide layer 166 may be formed above the drain 120 of the memory transistor 190. Conductive contacts (not shown) may be formed above the silicide layers 162, 166 and connected to external input terminals to bias the source 118 and drain 120. In one embodiment, the external input terminals may be different from the input terminal for capacitor 198. A p+ doped semiconductor region comprising a substrate terminal 116 may be formed in the semiconductor substrate 110 and may be separated from the source region 118 by a shallow trench isolation (STI) structure 126.

The n-well capacitor 192 may comprise an n-well 112 adjacent to the semiconductor substrate 110. An STI structure 132 may be formed between the n-well 112 and the semiconductor substrate 110. An n-well capacitor electrode 136 may be formed above the n-well 112 and may be electrically connected to the gate electrode 138 of the memory transistor 190. A line 196 indicates the electrical connection between the n-well capacitor electrode 136 and the gate electrode 138 of the memory transistor 190. The n-well capacitor electrode 136 and the gate electrode 138 of the memory transistor 190 may be made of a single floating gate comprising a single layer of polysilicon. An n-well dielectric 130 may be formed between the n-well capacitor electrode 136 and the n-well 112. An n+ doped semiconductor region 122 may be formed in the n-well 112 adjacent to the n-well dielectric 130. A silicide layer 168 may be formed above the n+ doped semiconductor region 122. The n+ doped semiconductor region 122 may be connected to an external input terminal for biasing the n-well capacitor 192. In one embodiment, the external input terminal for biasing the n-well capacitor 192 may be different from the input terminal connected to the second conductive contact 188 of the second capacitor 198.

Figure 1B:
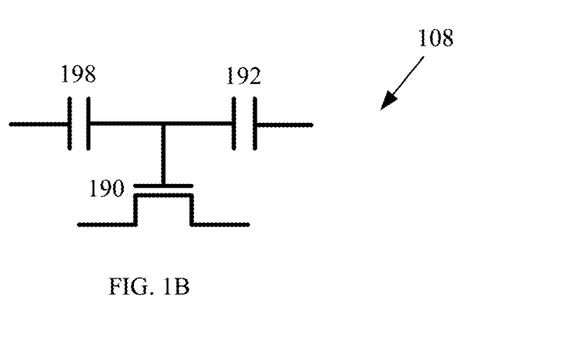
FIG. 1B is a circuit diagram of a nonvolatile memory device, according to embodiments of the disclosure.

FIG. 1B is a circuit diagram of a nonvolatile memory device 108, according to embodiments of the disclosure. Referring to FIG. 1B, an n-well capacitor 192 may be coupled to a memory transistor 190. A second capacitor 198 may be coupled to the memory transistor 190. The n-well capacitor 192 and the second capacitor 198 may be connected to separate input terminals.

Figure 2:
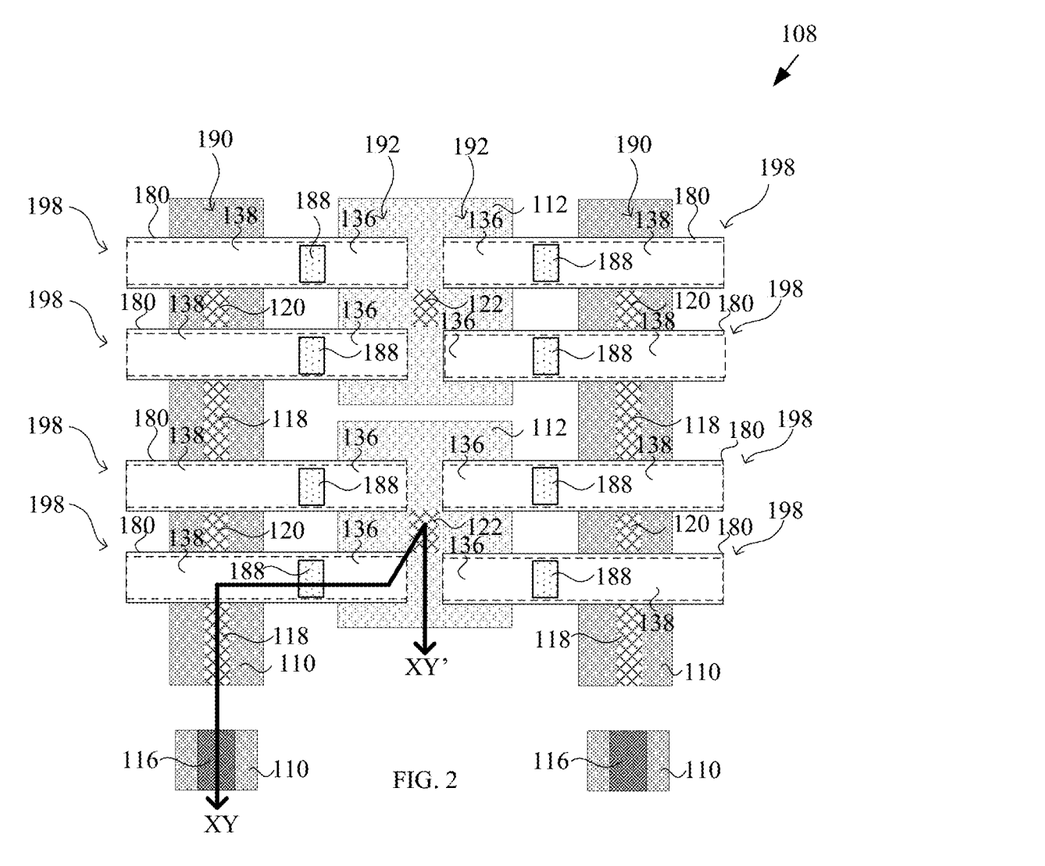
FIG. 2 is a top view of an array of nonvolatile memory devices, according to embodiments of the disclosure.
Figure 5:
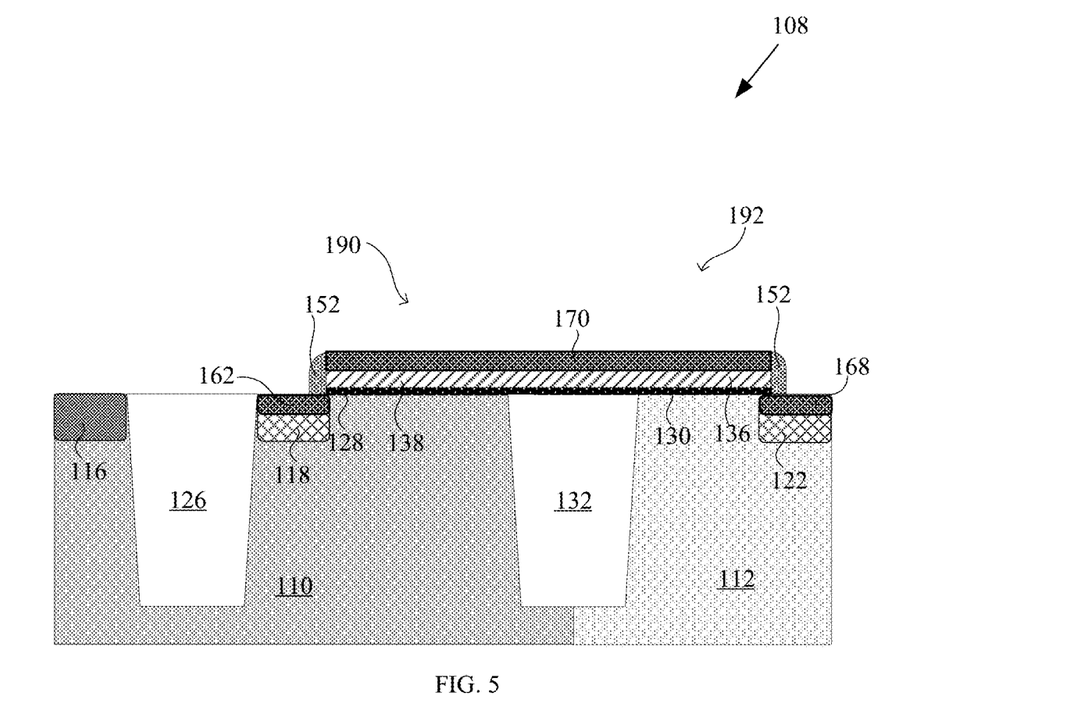
FIGS. 5 and 6 illustrate a fabrication process flow for a nonvolatile memory device shown in FIG. 2, according to embodiments of the disclosure.

FIG. 2 is a top view of an array of nonvolatile memory devices 108, according to embodiments of the disclosure. A cross-section indicated by section line XY-XY' is shown in FIG. 5 and will be discussed in more detail when describing FIG. 5. Referring to FIG. 2, the second capacitor 198 may be formed above the memory transistor 190 and the n-well capacitor 192. The first electrode 180 of the second capacitor 198 may overlap with the floating gate that makes up the gate electrode 138 of the memory transistor 190 and the n-well capacitor electrode 136. The floating gate is indicated as a dashed outline. Although not shown, the second electrode 186 of the second capacitor 198 may overlap with the first electrode 180 of the second capacitor 198. The first electrode 180 and the second electrode 186 of the second capacitor 198 may have a length and a width that are equal to or larger than a length and a width of the floating gate.

The gate electrode 138 of the memory transistor 190 may overlie the semiconductor substrate 110 and the n-well capacitor electrode 136 may overlie the n-well 112. Although not shown, the semiconductor substrate 110 and the n-well 112 may be separated by an isolation structure. A source 118 may be formed in the semiconductor substrate 110 adjacent to the gate electrode 138 of the memory transistor 190. A drain 120 may be formed in the semiconductor substrate 110 adjacent to an opposite side of the gate electrode 138 of the memory transistor 190 from the source 118. A substrate terminal 116 may be formed in a portion of the semiconductor substrate 110. Although not shown, the substrate terminal 116 may be separated from the source 118 by an isolation structure. An n+ doped semiconductor region 122 may be formed in the n-well 112 adjacent to the n-well capacitor electrode 136.

An exemplary set of biasing conditions for an embodiment of the nonvolatile memory device 108 shown in FIG. 1 is listed in Table 1. During programming, a voltage of approximately five to eight volts (5 to 8V) may be applied to the n-well capacitor 192 and to the drain 120. A biasing voltage of approximately 3V may be applied to the source 118 and the substrate terminal 116 may be grounded. A positive voltage of approximately 5.5V may be applied to the input terminal of the second capacitor 198. The biasing conditions create a strong vertically oriented electric field in a channel region between the source 118 and the drain 120 resulting in injection of hot electrons to an edge portion of the gate electrode 138 of the memory transistor 190 from the channel region.

TABLE 1

| | n-well capacitor | drain | source | substrate | second capacitor |
|---|---|---|---|---|---|
| Program | ~5 to 8 V | ~5 to 8 V | 3 V | 0 V | 5.5 V |
| Erase | 0 V | ~5 to 8 V | 0 V | 0 V | −5.5 V |
| Read | 2.5 V | 1 V | 0 V | 0 V | 0 V/Float |

The programming voltages applied to the n-well capacitor 192 and to the drain 120 are lowered due to an increase in the coupling ratio of the nonvolatile memory device 108 after application of a positive biasing voltage to the second capacitor 198. The second capacitor 198 increases the effectiveness of voltage transfer from the n-well capacitor 192 and the second capacitor 198 to the gate electrode 138 of the memory transistor 190. The coupling ratio of the nonvolatile memory device 108 may be the sum of a capacitance of the second capacitor 198 ($C_{198}$) and a capacitance of the n-well capacitor 192 ($C_{192}$) divided by the sum of a capacitance ($C_{138}$) of the gate electrode 138 of the memory transistor 190, the capacitance of the second capacitor 198 ($C_{198}$) and the capacitance of the n-well capacitor 192 ($C_{192}$). Therefore, the coupling ratio of the nonvolatile memory device 108=$(C_{198}+C_{192})/(C_{138}+C_{198}+C_{192})$. The capacitance of the second capacitor 198 may be equal to or larger than the capacitance of the n-well capacitor 192 as the second capacitor 198 may at least partially overlap with the floating gate and the insulating layer 182 may have a thickness comparable to or thinner than the dielectric layer 130. The coupling ratio of the nonvolatile memory device 108 may be increased from approximately 80% to approximately 90% or larger. The reliability of the nonvolatile memory device 108 is improved due to lower programming biases and lower electric field during programming.

During erasing, the n-well capacitor 192 may be grounded and a voltage of approximately five to 8V (5 to 8V) may be applied to the drain 120 of the memory transistor 190. The source 118 of the memory transistor 190 and the substrate terminal 116 may grounded. A negative voltage of approximately −5.5V may be applied to the input terminal of the second capacitor 198 for coupling to the gate electrode 138 of the memory transistor 190. The biasing conditions may generate electron hole pairs in the drain 120 region by band to band tunneling (BTB). The holes may be injected into the gate electrode 138 of the memory transistor 190 through the dielectric layer 128 and recombine with the electrons stored in the gate electrode 138. The negative voltage applied to the second capacitor 198 during an erase operation lowers the erase voltage applied to the drain 120 of the memory transistor 190 and increases the efficiency of hole injection into the gate electrode 138 of the memory transistor 190. The reliability and lifetime of the nonvolatile memory device 108 may be improved due to the lower erase voltage used and lower electric field during erase.

During a reading operation, a positive bias of approximately 2.5V may be applied to the n-well capacitor 192 and approximately 1V may be applied to the drain 120 of the memory transistor 190. The source 118, the substrate terminal 116 and the second capacitor 198 may be grounded. Alternatively, the second capacitor 198 may be floating or unconnected to any biasing voltage. In this biasing condition, a current may be detected at the drain 120 of the memory transistor 190 depending on a threshold voltage of the memory transistor 190. For example, the threshold voltage of the memory transistor 190 is low after an erase operation and a current may be detected at the drain 120 of the memory transistor 190. A program operation may lead to a high threshold voltage of the memory transistor 190 and less current or negligible current may be detected at the drain 120 of the memory transistor 190.

Figure 3A:
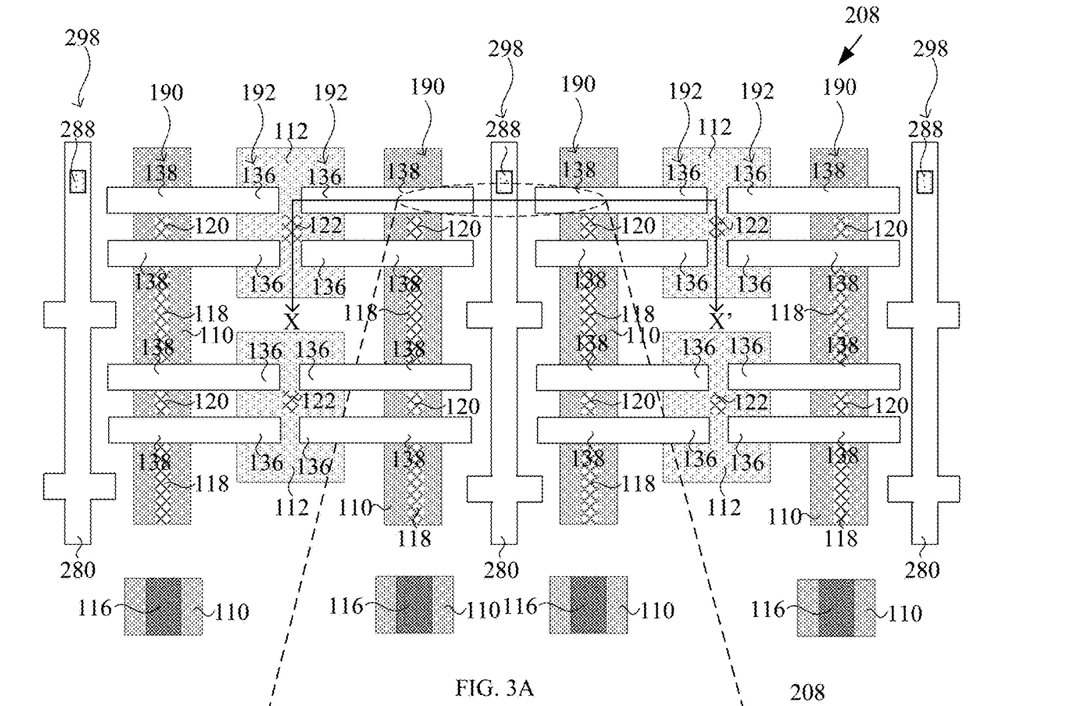
FIG. 3A is a top view of an array of nonvolatile memory devices, according to further embodiments of the disclosure.

The embodiments shown in FIGS. 1 and 2 may be modified to form alternative embodiments without departing from the scope of the disclosure. For example, FIG. 3A is a top view of an array of nonvolatile memory devices 208, according to further embodiments of the disclosure. The same reference numerals used in FIGS. 1 and 2 are also used in FIG. 3A to refer to identical features. In contrast to the nonvolatile memory device array 108 shown in FIG. 2, the nonvolatile memory device 208 illustrated in FIG. 3A has a second capacitor 298 adjacent to the gate electrode 138 of the memory transistor 190.

Referring to FIG. 3A, an electrode 280 of the second capacitor 298 may be formed next to a gate electrode 138 of a memory transistor 190. A conductive contact 288 may be formed above the electrode 280 of the second capacitor 298 for connection to an input terminal. The gate electrode 138 of the memory transistor 190 and an n-well capacitor electrode 136 may be made of a single floating gate. The floating gate may extend across a semiconductor substrate 110 and over an n-well 112. Although not shown, an isolation structure may separate the semiconductor substrate 110 from the n-well 112. In embodiments, the floating gate may extend across the isolation structure separating the semiconductor substrate 110 from the n-well 112 The semiconductor substrate 110 may be p-doped and comprises a p-well.

A source 118 may be formed in the semiconductor substrate 110 adjacent to the gate electrode 138 of the memory transistor 190. A drain 120 may be formed in the semiconductor substrate 110 adjacent to an opposite side of the gate electrode 138 of the memory transistor 190 from the source 118. A substrate terminal 116 comprising a p+ doped semiconductor region may be formed in a portion of the semiconductor substrate 110. Although not shown, the substrate terminal 116 may be separated from the source 118 by an isolation structure. An n+ doped semiconductor region 122 may be formed in the n-well 112 adjacent to the n-well capacitor electrode 136.

Figure 3B:
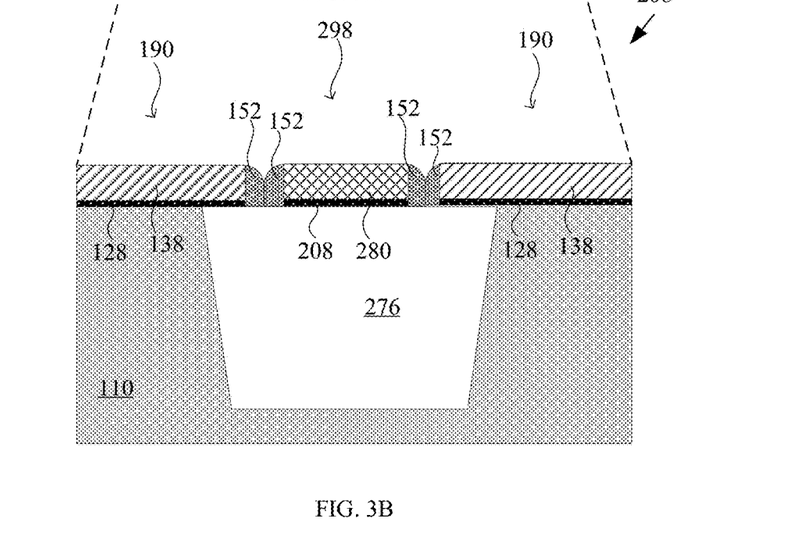
FIG. 3B is a cross-section view of a portion of a nonvolatile memory device taken along section line X-X' of FIG. 3A, according to further embodiments of the disclosure.

FIG. 3B is a cross-section view of a portion of a nonvolatile memory device 208 taken along section line X-X' of FIG. 3A, according to further embodiments of the disclosure. Referring to FIG. 3B, a dielectric spacer 152 may be formed adjacent to sidewalls of the electrode 280 of the second capacitor 298 and sidewalls of the gate electrode 138 of the memory transistor 190. In embodiments, the gate electrode 138 of the memory transistor 190 or the floating gate may be a first electrode of the second capacitor 298 and the electrode 280 may be a second electrode of the second capacitor 298. In embodiments, the gate electrode 138 of the memory transistor 190 has substantially similar thickness as the electrode 280 of the second capacitor 298. The dielectric spacer 152 may form an insulating layer between the first and second electrodes of the second capacitor 298. The first and second electrodes of the second capacitor 298 may be made of polysilicon. In embodiments, the polysilicon may be doped or undoped. In embodiments, the polysilicon may be doped with boron, phosphorus or arsenic. The dielectric spacer 152 may be made of silicon dioxide ($SiO_2$) or silicon nitride (SiN). An STI structure 276 may be formed in the semiconductor substrate 110 and the second electrode or the electrode 280 of the second capacitor 298 may be formed above the STI structure 276. A dielectric layer 208 may be formed between the electrode 280 and the STI structure 276. The dielectric layer 208 may be made of silicon dioxide.

Figure 4:
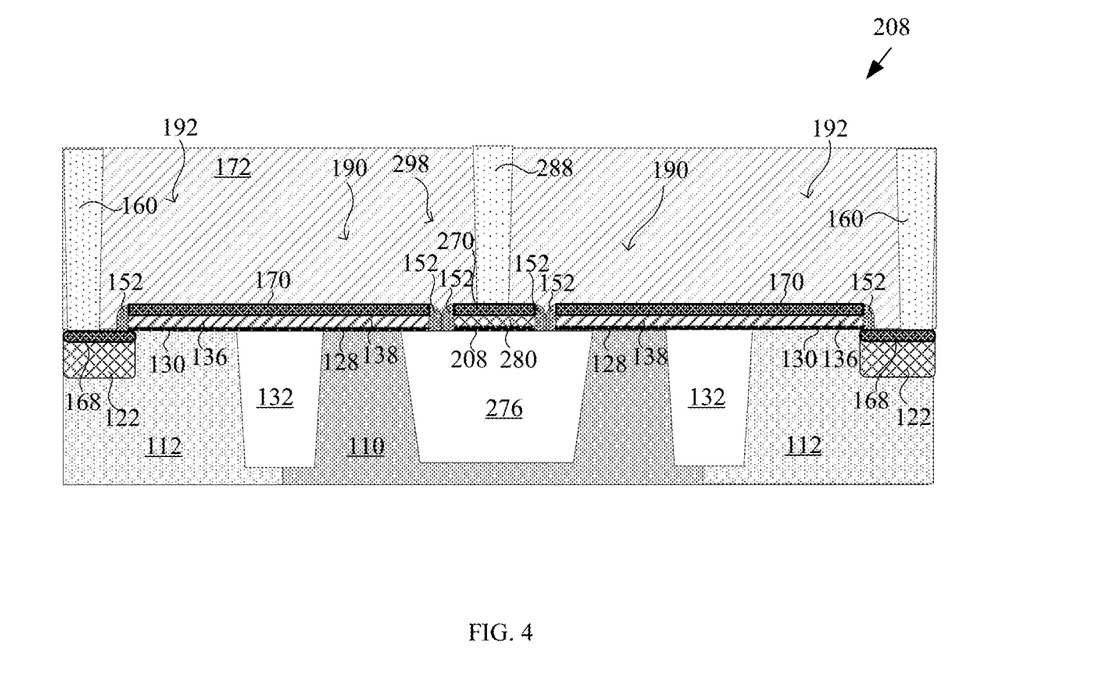
FIG. 4 is a cross-section view of a nonvolatile memory device taken along section line X-X' of FIG. 3A, according to further embodiments of the disclosure.

FIG. 4 is a cross-section view of a nonvolatile memory device 208 taken along section line X-X' of FIG. 3A, according to further embodiments of the disclosure. Referring to FIG. 4, the nonvolatile memory device 208 comprises a memory transistor 190 comprising a gate electrode 138. A first capacitor comprising an n-well capacitor 192 may be coupled to the gate electrode 138 of the memory transistor 190. A second capacitor 298 may comprise the gate electrode 138 of the memory transistor 190 as a first electrode and the electrode 280 as a second electrode. A silicide layer 270 may be formed above the electrode 280 and a conductive contact 288 may be formed above the silicide layer 270.

A semiconductor substrate 110 may be below the gate electrode 138 of the memory transistor 190 and a dielectric layer 128 of the memory transistor 190 may be between the gate electrode 138 and the semiconductor substrate 110. An n-well 112 may be formed adjacent to the semiconductor substrate 110 and an STI structure 132 may separate the n-well 112 from the semiconductor substrate 110. The n-well capacitor 192 may comprise an n-well 112 and an n-well capacitor electrode 136 above the n-well 112. The n-well capacitor electrode 136 may be electrically connected to the gate electrode 138 of the memory transistor 190. An n-well dielectric 130 may be between the n-well capacitor electrode 136 and the n-well 112. An n+ doped semiconductor region 122 in the n-well 112 may be formed adjacent to the n-well dielectric 130.

Figure 6:
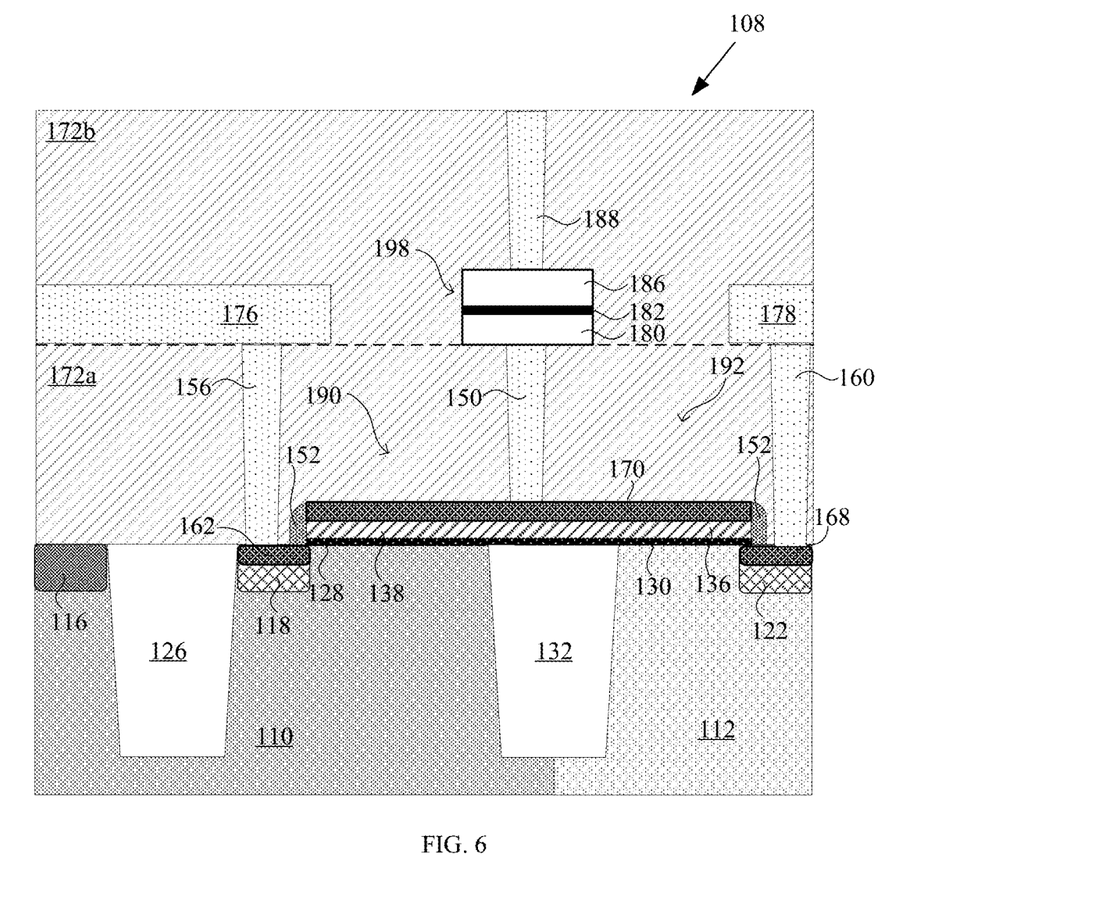

FIGS. 5 and 6 illustrate a fabrication process flow for the nonvolatile memory device 108 shown in FIG. 2, according to embodiments of the disclosure. FIG. 5 shows a partially completed nonvolatile memory device 108 taken along section line XY-XY' of FIG. 2, according to embodiments of the disclosure. Referring to FIG. 5, a semiconductor substrate 110 may be provided. STI structures 126 and 132 may be formed in the semiconductor substrate 110. An n-well 112 may be formed adjacent to the semiconductor substrate 110 next to the STI structure 132. A memory transistor 190 comprising a gate electrode 138 may be provided. A first capacitor comprising an n n-well capacitor 192 coupled to the gate electrode 138 of the memory transistor 190 may be provided. The gate electrode 138 of the memory transistor 190 and an n-well capacitor electrode 136 may be formed by depositing a layer of polysilicon over the semiconductor substrate 110, the STI structure 132 and the n-well 112. The polysilicon layer may be doped or undoped. The polysilicon layer may be patterned by conventional photoresist process and etching. A conventional photoresist process may include depositing a layer of photoresist over the polysilicon layer followed by exposure and developing to form a photoresist pattern. Portions of the polysilicon layer not covered by the photoresist pattern may be removed by a wet or dry etch to leave behind a portion of the polysilicon layer over the semiconductor substrate 110 and the n-well 112 thereby forming the gate electrode 138 of the memory transistor 190 and the n-well capacitor electrode 136, respectively. A portion of the polysilicon layer over the STI structure 132 electrically connects the gate electrode 138 of the memory transistor 190 and the n-well capacitor electrode 136. The photoresist pattern may subsequently be removed. Spacer structures 152 may be formed adjacent to sidewalls of the gate electrode 138 of the memory transistor 190 and the n-well capacitor electrode 136.

A source 118 may be formed in the semiconductor substrate 110 adjacent to the gate electrode 138 of the memory transistor 190. Although not shown, a drain may be formed in the semiconductor substrate 110 adjacent to an opposite side of the gate electrode 138 from the source 118. An n+ doped semiconductor region 122 may be formed in the n-well 112 adjacent to the n-well capacitor electrode 136. The source 118, drain and n+ doped semiconductor region 122 may be formed simultaneously. A substrate terminal 116 may be formed in the semiconductor substrate 110 adjacent to the STI structure 126. A silicide layer 162 may be formed above the source 118 of the memory transistor 190 and a silicide layer 168 may be formed above the n+ doped semiconductor region 122. A silicide layer 170 may be formed above the gate electrode 138 of the memory transistor 190 and the n-well electrode 136.

FIG. 6 shows a nonvolatile memory device 108 after formation of a second capacitor 198, according to embodiments of the disclosure. Referring to FIG. 6, a second capacitor 198 comprising a first electrode 180 and a second electrode 186 may be provided. The second electrode 186 of the second capacitor 198 may be connected to an input terminal. Providing the second capacitor 198 may include forming a first [conductive contact 150 above the silicide layer 170. The formation of the conductive contact 150 may include depositing a lower portion of an interlayer dielectric (ILD) layer 172a over the memory transistor 190 and the n-well capacitor 192. A dashed line indicates a top surface of the lower portion of the ILD layer 172a. An opening over the silicide layer 170 may be formed in the lower portion of the ILD layer 172a and a suitable conductive material such as tungsten (W) may be deposited in the opening in the lower portion of the ILD layer 172a. A planarization process such as chemical mechanical planarization (CMP) may be used to remove the conductive material above the lower portion of the ILD layer 172a leaving behind the conductive material in the opening in the lower portion of the ILD layer 172a thereby forming the conductive contact 150. Conductive contacts 156 and 160 may be formed above the source 118 and the n+ doped semiconductor region 122, respectively.

A first electrode 180 of the second capacitor 198 may be formed above the first conductive contact 150. An insulating layer 182 may be formed adjacent to the first electrode 180 of the second capacitor 198. A second electrode 186 of the second capacitor 198 may be formed adjacent to the insulating layer 182. The formation of the first electrode 180 of the second capacitor 198, the insulating layer 182 and the second electrode 186 of the second capacitor 198 may include depositing a first layer of suitable metallic material such as TiN over a top surface of the lower portion of the ILD layer 172a and over the first conductive contact 150. A layer of suitable insulating material such as SiN may be deposited over the first layer of metallic material. A second layer of suitable metallic material such as TiN may be deposited over the layer of insulating material. The deposition processes may be by atomic layer deposition (ALD), chemical vapor deposition (CVD), physical vapor deposition (PVD) or any other suitable deposition processes. The first layer of metallic material, the layer of insulating material and the second layer of metallic material may be patterned by conventional photoresist process and etching to leave behind a portion of the first layer of metallic material, the layer of insulating material and the second layer of metallic material thereby forming the first electrode 180 of the second capacitor 198, the insulating layer 182 and the second electrode 186 of the second capacitor 198, respectively.

Metal lines 176 and 178 may be formed above the top surface of the lower portion of the ILD layer 172a. The metal lines 176 and 178 may be connected to the conductive contacts 156 and 160, respectively. The formation of the metal lines 176 and 178 may include depositing a layer of suitable metal including copper, aluminum, or any other suitable metal over the top surface of the lower portion of the ILD layer 172a followed by patterning by conventional photoresist process and etching to leave behind a portion of the metal layer over the top surface of the lower portion of the ILD layer 172a and the conductive contacts 156 and 160 thereby forming the metal lines 176 and 178, respectively. A protective layer such as photoresist or dielectric may be deposited over the second capacitor 198 prior to the formation of the metal lines 176 and 178. The protective layer may be removed by a wet or dry etch after the formation of the metal lines 176 and 178. An upper portion of an ILD layer 172b may be deposited over the lower portion of the ILD layer 172a, the metal lines 176 and 178 and the second capacitor 198. A second conductive contact 188 connected to an input terminal may be formed in the upper portion of the ILD layer 172b above the second electrode 186 of the second capacitor 198.

Figure 7:
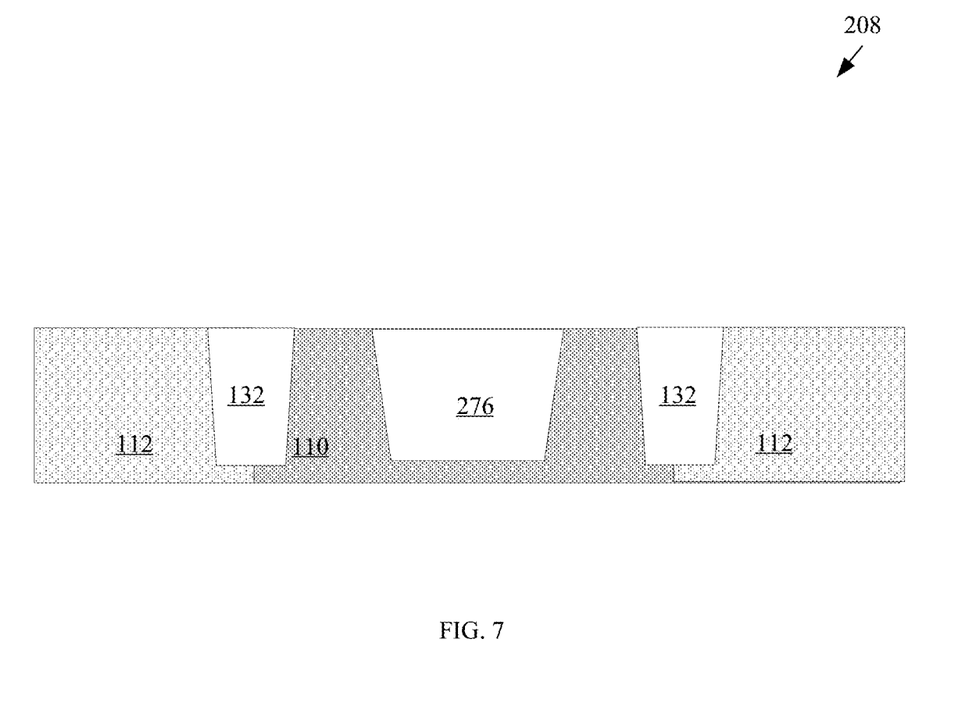
FIGS. 7 to 10 illustrate a fabrication process flow for the nonvolatile memory device shown in FIG. 4, according to further embodiments of the disclosure.

FIGS. 7 to 10 illustrate a fabrication process flow for the nonvolatile memory device 208 shown in FIG. 4, according to further embodiments of the disclosure. FIG. 7 shows a partially completed nonvolatile memory device 208, according to embodiments of the disclosure. Referring to FIG. 7, a semiconductor substrate 110 and an n-well 112 adjacent to the semiconductor substrate 110 may be provided. An STI structure 132 may be provided between the semiconductor substrate 110 and the n-well 112. An STI structure 276 may be provided in the semiconductor substrate 110. Providing the semiconductor substrate 110, the n-well 112 and the STI structures 132 and 276 are well known in the art and will not be further elaborated upon.

Figure 8:
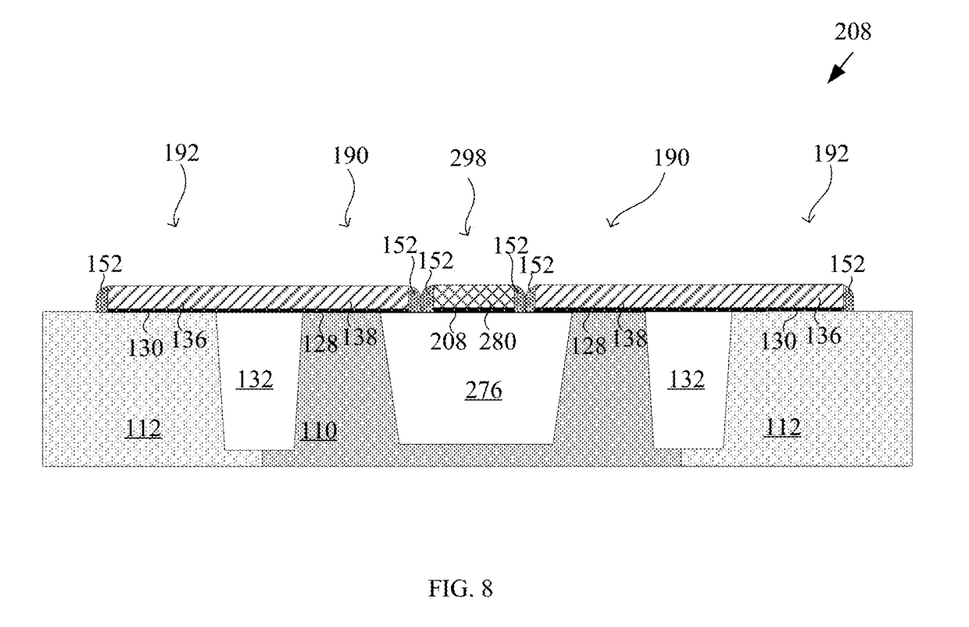

FIG. 8 shows a partially completed nonvolatile memory device 208 after providing a memory transistor 190, a first capacitor and a second capacitor 298, according to embodiments of the disclosure. Referring to FIG. 8, a memory transistor 190 comprising a gate electrode 138 may be provided. A first capacitor comprising an n-well capacitor 192 coupled to the gate electrode 138 of the memory transistor 190 may be provided. A second capacitor 298 comprising a first electrode and a second electrode may be provided. The first electrode of the second capacitor 298 may comprise the gate electrode 138 of the memory transistor 190. The second electrode of the second capacitor 298 may comprise electrode 280. Providing the memory transistor 190 may include forming the gate electrode 138 of the memory transistor 190. Providing the second capacitor 298 may include forming electrode 280. The formation of the gate electrode 138 of the memory transistor 190, an n-well capacitor electrode 136 of the n-well capacitor 192 and electrode 280 of the second capacitor 298 may include depositing a layer of polysilicon over the n-well 112, the semiconductor substrate 110 and STI structures 132 and 276. The polysilicon layer may be doped or undoped. The polysilicon layer may be patterned by conventional photoresist process and etching to leave behind a layer of polysilicon over the STI structure 276 thereby forming the electrode 280 of the second capacitor 298. The polysilicon layer may be patterned by conventional photoresist process and etching to leave behind a portion of a polysilicon layer extending over the n-well 112, STI structure 132 and the semiconductor substrate 110. A portion of the polysilicon layer over the n-well 112 forms the n-well capacitor electrode 136 of the n-well capacitor 192. A portion of the polysilicon layer over the semiconductor substrate 110 forms the gate electrode 138 of the memory transistor 190. A portion of the polysilicon layer over the STI structure 132 provides an electrical connection between the n-well capacitor electrode 136 and the gate electrode 138 of the memory transistor 190. The electrode 280 of the second capacitor 298 may be formed simultaneously with the gate electrode 138 of the memory transistor 190 and the n-well capacitor electrode 136.

A spacer dielectric 152 may be formed adjacent to sidewalls of the gate electrode 138 of the memory transistor 190, the n-well capacitor electrode 136 and the electrode 280 of the second capacitor 298. The formation of spacer dielectric 152 may include depositing a layer of suitable dielectric material such as silicon nitride, silicon oxynitride, silicon dioxide or silicon oxycarbonitride over the gate electrode 138 of the memory transistor 190, electrode 280 of the second capacitor 298 and the n-well capacitor electrode 136. The dielectric material may be removed from top surfaces of the gate electrode 138 of the memory transistor 190, electrode 280 of the second capacitor 298 and the n-well capacitor electrode 136 to leave behind the dielectric material on sidewalls of the gate electrode 138 of the memory transistor 190, electrode 280 of the second capacitor 298 and the n-well capacitor electrode 136 thereby forming the spacer dielectric 152. The removal process may be by anisotropic etching. The term anisotropic etching may refer to an etching process that removes a target material in a specific direction.

Figure 9:
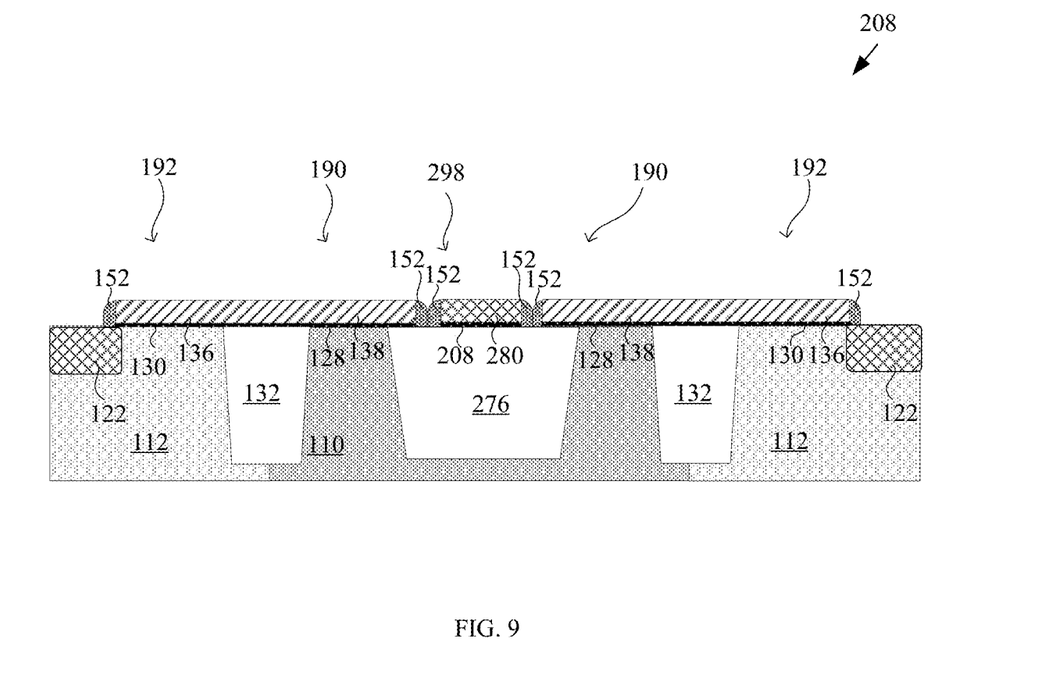

FIG. 9 shows a partially completed nonvolatile memory device 208 after formation of an n+ doped semiconductor region 122, according to embodiments of the disclosure. Referring to FIG. 9, the n+ doped semiconductor region 122 may be formed in the n-well 112 adjacent to an n-well capacitor electrode 136 of the n-well capacitor 192.

Figure 10:
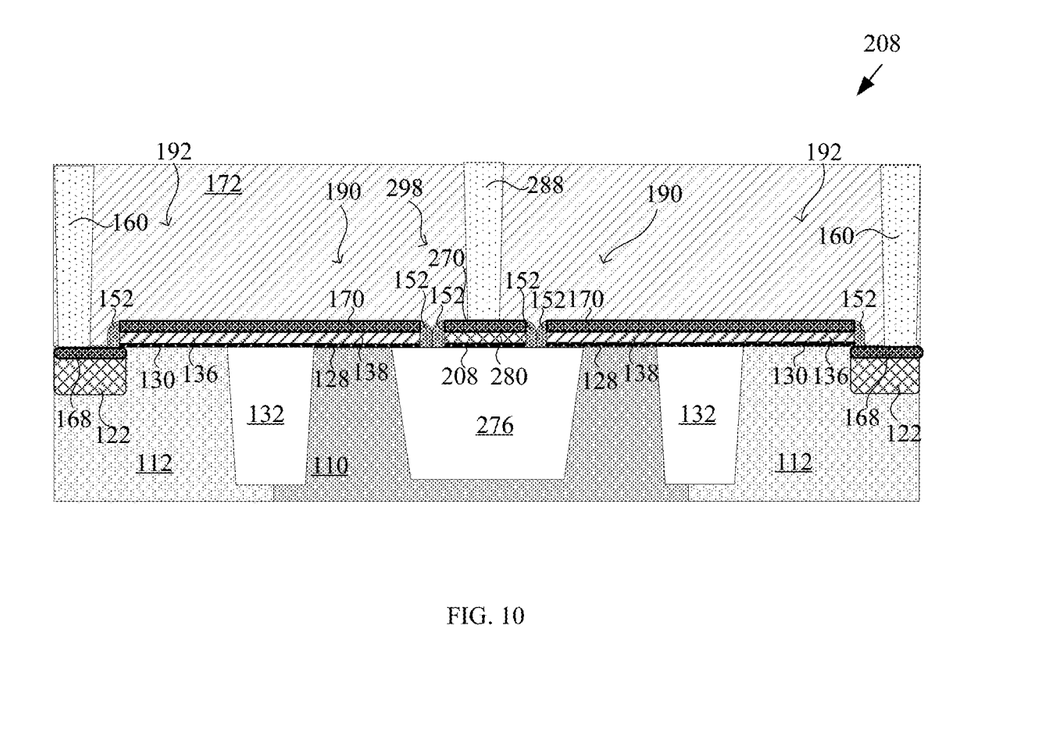

FIG. 10 shows a nonvolatile memory device 208 after formation of a conductive contact 288 above the electrode 280 of the second capacitor 298, according to embodiments of the disclosure. A silicide layer 270 may be formed above the electrode 280 of the second capacitor 298 prior to the formation of the conductive contact 288. The formation of the conductive contact 288 may include depositing an ILD layer 172 over the second electrode 280 of the second capacitor 298 and forming an opening in the ILD layer 172. A suitable conductive material such as tungsten (W) may be deposited into the opening in the ILD layer 172. A planarization process such as CMP may be used to remove the conductive material above the ILD layer 172 leaving the conductive material in the opening in the ILD layer 172 thereby forming the conductive contact 288. The conductive contact 288 may be connected to an external input terminal to bias the second capacitor 298.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed:

1. A nonvolatile memory device comprising:
   a memory transistor;
   a first capacitor laterally adjacent to and coupled to the memory transistor;
   a first input terminal coupled to the first capacitor;
   a second capacitor vertically over and coupled to the memory transistor, wherein the second capacitor comprises:
      a first capacitor electrode spaced apart from and at least partially overlapping the memory transistor; and
      a second capacitor electrode over the first capacitor electrode; and
   a second input terminal coupled to the second capacitor electrode, wherein the second input terminal is electrically separated from the first input terminal.

2. The nonvolatile memory device of claim 1, wherein the first capacitor electrode is coupled to a gate electrode of the memory transistor.

3. The nonvolatile memory device of claim 2, wherein the memory transistor further comprises:
   a semiconductor substrate below the gate electrode of the memory transistor;
   a dielectric layer between the gate electrode of the memory transistor and the semiconductor substrate;
   a drain of the memory transistor in the semiconductor substrate adjacent to the dielectric layer; and
   a source of the memory transistor in the semiconductor substrate adjacent to an opposite side of the dielectric layer from the drain of the memory transistor.

4. The nonvolatile memory device of claim 2, further comprising:
   a contact structure between the second capacitor and the memory transistor, the contact structure coupling the first capacitor electrode of the second capacitor to the gate electrode of the memory transistor.

5. The nonvolatile memory device of claim 3, wherein the first capacitor further comprises:
   an n-well in the semiconductor substrate and an n-well capacitor electrode above the n-well, wherein the n-well capacitor electrode is connected to the gate electrode of the memory transistor;
   an n-well dielectric between the n-well capacitor electrode and the n-well; and
   an n+ doped semiconductor region in the n-well adjacent to the n-well dielectric.

6. The nonvolatile memory device of claim 5, wherein the n+ doped semiconductor region is connected to the first input terminal.

7. The nonvolatile memory device of claim 5, wherein the semiconductor substrate is p-doped and comprises a p-well, and the p-well is under the gate electrode of the memory transistor and adjacent to the n-well.

8. The nonvolatile memory device of claim 7, further comprising an isolation structure in the semiconductor substrate, and the p-well is at least partially separated from the n-well by the isolation structure.

9. The nonvolatile memory device of claim 5, wherein the n-well capacitor electrode and the gate electrode of the memory transistor constitute a floating gate of the nonvolatile memory device.

10. The nonvolatile memory device of claim 9, wherein the first capacitor electrode of the second capacitor has a first length and a first width, the floating gate has a second length and a second width, and the first length and the first width are at least equal to the second length and the second width.

11. The nonvolatile memory device of claim 5, wherein the n-well is coupled to at least two n-well capacitor electrodes.

12. The nonvolatile memory device of claim 1, wherein the first capacitor comprises a semiconductor material and the second capacitor comprises a metallic material.

13. A nonvolatile memory device comprising:
   a memory transistor comprising a gate electrode;
   a first capacitor laterally adjacent to the gate electrode of the memory transistor, the first capacitor comprises a first capacitor electrode coupled to the gate electrode;
   a first input terminal coupled to the first capacitor electrode;
   a second capacitor vertically over and coupled to the gate electrode of the memory transistor; the second capacitor comprising:
      a second capacitor electrode, the second capacitor electrode spaced apart from and at least partially overlaps the gate electrode;

an insulating layer to over the second capacitor electrode; and a third capacitor electrode over the insulating layer;

a contact structure between and coupling the gate electrode and the second capacitor electrode; and a second input terminal coupled to the third capacitor electrode, wherein the second input terminal is electrically separated from the first input terminal.

14. The nonvolatile memory device of claim 13, further comprising a metal line over the memory transistor, and the second capacitor is laterally adjacent to and within the same level as the metal line.

15. The nonvolatile memory device of claim 14, wherein the metal line comprises a first lower surface, and the first capacitor electrode of the second capacitor comprises a second lower surface substantially coplanar with the first lower surface.

16. The nonvolatile memory device of claim 13, further comprising:

a semiconductor substrate;

a p-well in the semiconductor substrate under the gate electrode of the memory transistor;

an n-well in the semiconductor substrate under the first capacitor electrode of the first capacitor, the n-well is laterally adjacent to the p-well; and an isolation structure in the semiconductor substrate at least partially separating the n-well from the p-well.

17. A method of fabricating a nonvolatile memory device comprising:

forming a memory transistor;

forming a first capacitor laterally adjacent to and coupled to the memory transistor;

forming a first input terminal coupled to the first capacitor;

forming a second capacitor vertically over and coupled to the memory transistor, the second capacitor comprising a first capacitor electrode spaced apart from and at least partially overlapping the memory transistor and a second capacitor electrode over the first capacitor electrode; and forming a second input terminal coupled to the second capacitor, wherein the second input terminal is electrically separated from the first input terminal.

18. The method of claim 17, wherein forming the memory transistor further comprises:

forming a gate electrode of the memory transistor over a semiconductor substrate.

19. The method of claim 18, wherein forming the second capacitor further comprises:

forming a first conductive contact above the gate electrode of the memory transistor;

forming the first capacitor electrode of the second capacitor above the first conductive contact;

forming an insulating layer above the first capacitor electrode of the second capacitor;

forming the second capacitor electrode of the second capacitor above the insulating layer; and forming a second conductive contact above the second capacitor electrode of the second capacitor, wherein the second conductive contact is coupled to the second input terminal.

* * * * *